United States Patent
Dong (10) Patent No.: US 9,057,899 B2
(45) Date of Patent: Jun. 16, 2015

(54) ARRAY SUBSTRATE AND LIQUID CRYSTAL PANEL

(71) Applicant: Shenzhen China Star Optoelectronics Technology Co., Ltd., Shenzhen, Guangdong (CN)

(72) Inventor: Chengcai Dong, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 14 days.

(21) Appl. No.: 14/233,387

(22) PCT Filed: Oct. 24, 2013

(86) PCT No.: PCT/CN2013/085841
§ 371 (c)(1),
(2) Date: Jan. 17, 2014

(87) PCT Pub. No.: WO2015/032115
PCT Pub. Date: Mar. 12, 2015

(65) Prior Publication Data
US 2015/0070613 A1 Mar. 12, 2015

(30) Foreign Application Priority Data
Sep. 9, 2013 (CN) .......................... 2013 1 04098076

(51) Int. Cl.
*G02F 1/133* (2006.01)
*H01L 27/12* (2006.01)
*G02F 1/1362* (2006.01)
*G02F 1/1343* (2006.01)
*G02F 1/1368* (2006.01)

(52) U.S. Cl.
CPC ...... *G02F 1/13306* (2013.01); *G02F 1/136286* (2013.01); *G02F 1/134309* (2013.01); *G02F 1/136213* (2013.01); *G02F 1/1368* (2013.01); *H01L 27/124* (2013.01); *G02F 2001/134345* (2013.01)

(58) Field of Classification Search
CPC .......... G02F 1/13306; G02F 1/136286; G02F 1/134309; G02F 1/136216; G02F 1/1368; H01L 27/124
See application file for complete search history.

(56) References Cited

U.S. PATENT DOCUMENTS

| | | | | |
|---|---|---|---|---|
| 6,590,553 | B1 * | 7/2003 | Kimura et al. | 345/92 |
| 7,319,444 | B2 * | 1/2008 | Jo | 345/76 |
| 7,859,500 | B2 * | 12/2010 | Sasabayashi et al. | 345/90 |
| 8,102,346 | B2 * | 1/2012 | Watanabe | 345/90 |
| 8,203,513 | B2 * | 6/2012 | Chung et al. | 345/88 |
| 8,525,761 | B2 * | 9/2013 | Sung et al. | 345/78 |
| 8,674,914 | B2 * | 3/2014 | Ohhashi | 345/83 |
| 8,970,574 | B2 * | 3/2015 | Kim et al. | 345/212 |
| 2011/0043498 | A1 * | 2/2011 | Tsubata | 345/204 |
| 2012/0162090 | A1 * | 6/2012 | Chang et al. | 345/173 |

* cited by examiner

*Primary Examiner* — Andrew Sasinowski
(74) *Attorney, Agent, or Firm* — Andrew C. Cheng (57) ABSTRACT

An array substrate and a liquid crystal panel are disclosed. Each of the pixel cells of the array substrate includes a voltage compensation circuit. When the scanning signals are inputted to the corresponding first scanning line of a farther pixel cell, the voltage compensation circuit of a current pixel cell operates on the second pixel electrode of the current pixel cell. As such, a ratio of a voltage difference between the second pixel electrode and the common electrode to the voltage difference between the first pixel electrode and the common electrode when the positive polarity is inversed is the same with the ratio when the negative polarity is inversed. In this way, the low color shift effect is enhanced.

16 Claims, 7 Drawing Sheets

ARRAY SUBSTRATE AND LIQUID CRYSTAL PANEL

BACKGROUND OF THE INVENTION

1. Field of the Invention

The present disclosure relates to liquid crystal display technology, and more particularly to an array substrate and a liquid crystal panel.

2. Discussion of the Related Art

Vertical alignment (VA) type liquid crystal panels are characterized by attributes such as quick response time and high contrastness, and thus are a current trend. However, as the effective reflective rates of the liquid crystal are not the same, the intensity of transmission lights may change. Specifically, the transmission rate is reduced when viewing at a squint angle. The color observed at the squint angle is different from that observed right ahead, which results in color shift. Especially, when the dimension of the liquid crystal panel grows, the color shift problem may get more and more serious at wide viewing angle.

Figure 1:
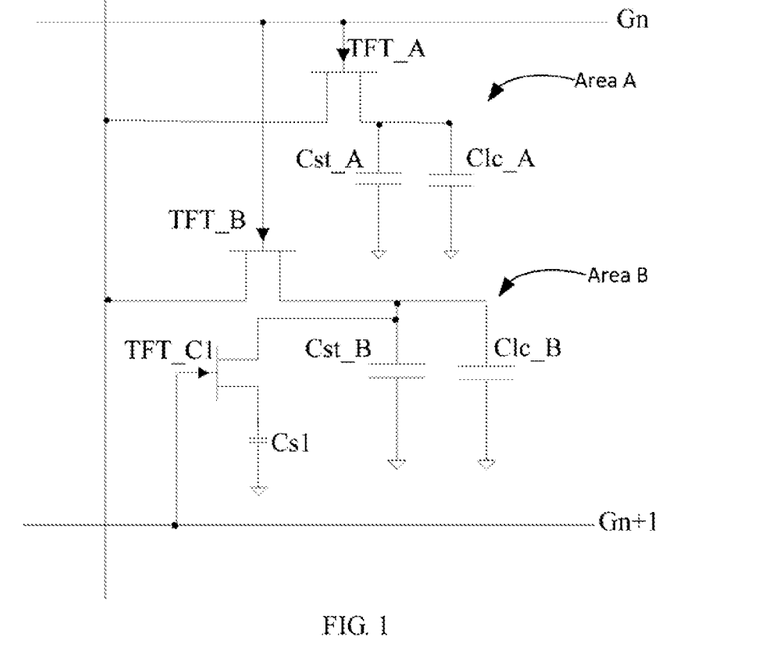
FIG. 1 is an equivalent circuit diagram of the pixel cell of one conventional array substrate.

FIG. 1 is an equivalent circuit diagram of one conventional array substrate. The array substrate includes scanning lines (Gn), data lines (Data), and pixel cells cooperatively defined by the scanning lines (Gn) and the data lines (Data). Each pixel cell includes an area "A" and an area "B". The area "A" is driven by TFT_A, and the area "B" is driven by TFT_B. Under the same grayscale, different voltages are applied to the area "A" and the area "B" so as to obtain different Gamma curve. As such, the Gamma curve composited by the two areas has a smaller difference when observed right ahead and when observed at the wide viewing angle, which obviously enhances the color shift. Specifically, the plurality of scanning lines are scanned in turn. When the n-th scanning line is scanned, the scanning signals are inputted to the scanning line (Gn) to turn on the TFT_A and TFT_B. The data lines (Data) charges a storage capacitor (Cst) and a liquid crystal capacitor (Clc) in the area "A" and the area "B" of the pixel cells. Pixel voltages of the area "A" and the area "B" are charged to reach the voltage of the data lines (Data). When the (n+1)-th scanning line is scanned, the scanning signals are inputted to the scanning line (Gn+1) to turn on the TFT_C1. The pixel voltage of the area "B" is changed due to the capacitor (Cs1) such that the pixel voltage of the area "A" is different from that of the area "B" to achieve low color shift effect.

As shown in FIG. 1, $\Delta V_1$ represents the voltage difference between the pixel voltage and the common electrode of the area "A". $\Delta V_2$ represents the voltage difference between the pixel voltage and the common electrode of the area "B". The ratio of $\Delta V_1$ to $\Delta V_2$, as shown in the equation below, is a key design parameter:

$$\frac{\Delta V_1}{\Delta V_2} = (Cst\_B + Clc\_B)/(Cst\_B + Clc\_B + 2Cs1)$$

The capacitance value of the capacitor (Cs1) determines the ratio $$\frac{\Delta V_1}{\Delta V_2}.$$

Figure 2:
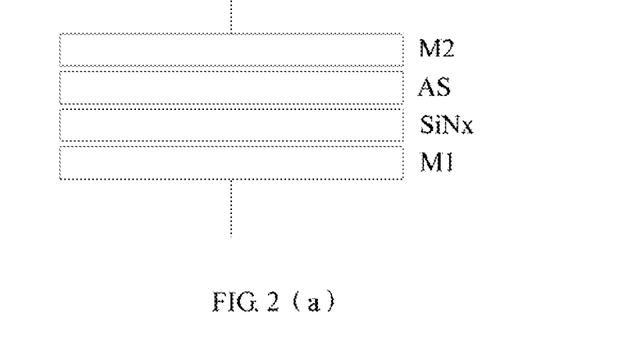
FIG. 2(a) is a schematic view of the capacitor Cs1 of the pixel cell of FIG. 1.
FIG. 2(b) is a curve diagram showing the relationship between the capacitance and the voltage of the capacitor Cs1 of FIG. 2(a).
Figure 2B:
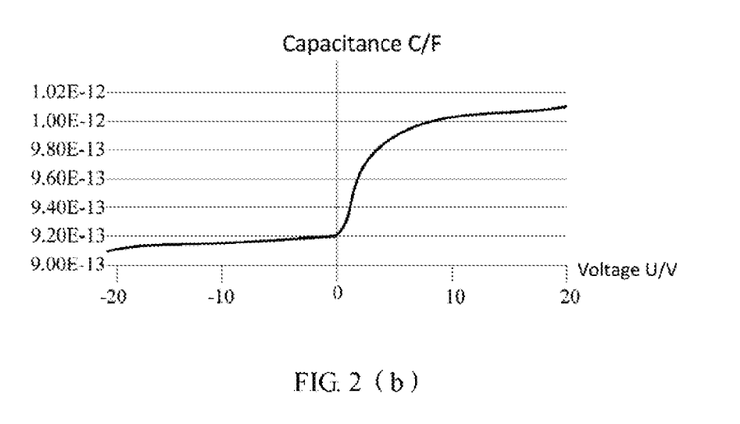

The structure of capacitor (Cs1) is shown in FIG. 2(a). M1 and M2 are metallic layers, SiNx is an insulation layer, and AS (a-si) is a semiconductor layer. M2 metallic layer connects to the TFT_C1. M1 metallic layer connects to the common electrode. The C-V cure of the capacitor is shown in FIG. 2(b), and the characteristic resides in that capacitance value for the positive half cycle is larger than that for the negative half cycle. Ideally, $$\frac{\Delta V_1}{\Delta V_2}$$

is the same regardless of when the positive polarity is inversed, i.e., the data voltage is larger than the voltage of the common electrode, or when the negative polarity is inversed, i.e., the data voltage is smaller than the voltage of the common electrode. Nevertheless, the capacitance value of the capacitor (Cs1) is larger when the positive polarity is inversed, which results in a smaller $$\frac{\Delta V_1}{\Delta V_2}.$$

That is, the ratio $V_B/V_A$ is not the same for the conditions when the positive or the negative polarity is inversed. As a result, the low color shift effect is decreased when the viewing angle is large. Also, the "burn-in" effect may occur at the same time.

SUMMARY

The object of the invention is to provide an array substrate and a liquid crystal panel to enhance the low color shift effect when the viewing angle is large. In addition, the array substrate and the liquid crystal panel can reduce the "burn-in" effect so as to enhance the display performance.

In one aspect, an array substrate includes: a plurality of first scanning lines, a plurality of data lines, a plurality of pixel cells, and a common electrode, each of the pixel cells corresponds to one first scanning line and one data line, each of the pixel cell includes a first pixel electrode, a second pixel electrode, a first switch, a second switch, a third switch, a first capacitor, and a voltage compensation circuit, the corresponding first scanning line of a current pixel cell connects to the first switch and the second switch, the corresponding data line of the current pixel cell respectively connects to the first pixel electrode and the second pixel electrode via the first switch and the second switch, the third switch connects to the corresponding first scanning line of a next pixel cell, the current pixel cell and the next pixel cell are arranged along a scanning direction and the next pixel cell is adjacent to the current pixel cell, the second pixel electrode connects to one end of the first capacitor via the third switch, the other end of the first capacitor connects to the common electrode, the voltage compensation circuit 1 connects to the corresponding second pixel electrode of the current pixel cell and connects to the corresponding first scanning line of a farther pixel cell, and the next pixel cell is arranged between the current pixel cell and the farther pixel cell along the scanning direction; and wherein the first scanning lines are scanned along the scanning direction in turn, the scanning signals are inputted to the corresponding first scanning line of the next pixel cell to turn on the third switch of the current pixel cell, a voltage of the second pixel electrode of the current pixel cell is changed due to the first capacitor, a capacitance of the first capacitor when a positive polarity is inversed is larger than the capacitance of the first capacitor when a negative polarity is inversed, when the scanning signals are inputted to the corresponding first scanning line of the farther pixel cell, the voltage compensation circuit of the current pixel cell operates on the second pixel electrode of the current pixel cell such that a ratio of a voltage difference between the second pixel electrode and the common electrode to the voltage difference between the first pixel electrode and the common electrode when the positive polarity is inversed is the same with the ratio when the negative polarity is inversed.

Wherein when the negative polarity is inversed and when the scanning signals are inputted to the corresponding first scanning lines of the farther pixel cell, the voltage compensation circuit of the current pixel cell is in an off-state such that the voltage of the second pixel electrode of the current pixel cell is retained at a level after being changed by the first capacitor, when the positive polarity is inversed and when the scanning signals are inputted to the corresponding first scanning lines of the farther pixel cell, the voltage compensation circuit of the current pixel cell is in an on-state such that the voltage of the second pixel electrode increased after being changed by the first capacitor, and thus the ratio of the voltage difference between the second pixel electrode and the common electrode to the voltage difference between the first pixel electrode and the common electrode when the positive polarity is inversed is the same with the ratio when the negative polarity is inversed.

Wherein the voltage compensation circuit includes a fourth switch, a fifth switch, a sixth switch, and a second capacitor, the fourth switch includes a control end, a first end, and a second end, the fifth switch and the sixth switch both include the control end, the input end and the output end, the control end of the fourth switch connects to the corresponding first scanning line of the farther pixel cell, the first end of the fourth switch connects to the second pixel electrode, the second end of the fourth switch connects to the output end of the sixth switch, the control end of the fifth switch connects to the first scanning line of the current pixel cell, the input end of the fifth switch connects to the corresponding data line of the current pixel cell, the output end of the fifth switch connects to one end of the second capacitor, the control end and the input end of the sixth switch connects to the output end of the fifth switch, and the other end of the second capacitor connects to the common electrode; and when the negative polarity is inversed, the scanning signals are inputted to the corresponding scanning line of the farther pixel cell to turn on the fourth switch of the current pixel cell, the sixth switch is in the off-state such that the voltage compensation circuit of the current pixel electrode is in the off-state, and when the positive polarity is inversed, the scanning signals are inputted to the corresponding scanning line of the farther pixel cell to turn on the fourth switch of the current pixel cell, the sixth switch is in the on-state such that the voltage compensation circuit of the current pixel electrode is in the on-state, the second capacitor of the current pixel cell charges the second pixel electrode via the sixth switch and the fourth switch in turn such that the voltage of the second pixel electrode is increased after being changed by the first capacitor.

Wherein the fourth switch, the fifth switch, and the sixth switch are thin film transistor (TFT) switches, a gate of TFT operating as the fourth switch corresponds to the control end of the fourth switch, a source of the ITT operating as the fourth switch corresponds to the first end of the fourth switch, a drain of the TFT operating as the fourth switch corresponds to the second end of the fourth switch, the gate of TFT operating as the fifth switch corresponds to the control end of the fifth switch, the source of the TFT operating as the fifth switch corresponds to the input end of the fifth switch, the drain of the TFT operating as the fifth switch corresponds to the output end of the fifth switch, and the gate of TFT operating as the sixth switch corresponds to the control end of the sixth switch, the source of the TFT operating as the sixth switch corresponds to the input end of the sixth switch, the drain of the TFT operating as the sixth switch corresponds to the output end of the sixth switch.

Wherein the first switch, the second switch, and the third switch are TFT switches.

In another aspect, an array substrate includes: a plurality of first scanning lines, a plurality of second scanning lines, a plurality of third scanning lines, a plurality of data lines, a plurality of pixel cells, and a common electrode, each of the pixel cells corresponds to one first scanning line, one second scanning line, one third scanning line and one data line, each of the pixel cell includes a first pixel electrode, a second pixel electrode, a first switch, a second switch, a third switch, a first capacitor, and a voltage compensation circuit, the corresponding first scanning line of a current pixel cell connects to the first switch and the second switch, the corresponding data line of the current pixel cell respectively connects to the first pixel electrode and the second pixel electrode via the first switch and the second switch, the corresponding second scanning line connects to the third switch, the second pixel electrode connects to one end of the first capacitor via the third switch, the other end of the first capacitor connects to the common electrode, the voltage compensation circuit connects to the corresponding third scanning line of the pixel cell and the second pixel electrode; and wherein the corresponding first, second, and third scanning lines of the current pixel cell are scanned in turn, the scanning signals inputted to the second scanning line turns on the third switch, the voltage of the second pixel electrode is changed by the first capacitor, a capacitance of the first capacitor when a positive polarity is inversed is larger than the capacitance of the first capacitor when a negative polarity is inversed, when the scanning signals are inputted to the third scanning line, the voltage compensation circuit operates on the second pixel electrode such that a ratio of a voltage difference between the second pixel electrode and the common electrode to the voltage difference between the first pixel electrode and the common electrode when the positive polarity is inversed is the same with the ratio when the negative polarity is inversed.

Wherein when the negative polarity is inversed and when the scanning signals are inputted to the third scanning line, the voltage compensation circuit is in an off-state such that the voltage of the second pixel electrode is retained as a level after being changed by the first capacitor, when the negative polarity is inversed and when the scanning signals are inputted to the third scanning line, the voltage compensation circuit is in an on-state such that the voltage of the second pixel electrode is increased after being changed by the first capacitor, and thus the ratio of the voltage difference between the second pixel electrode and the common electrode to the voltage difference between the first pixel electrode and the common electrode when the positive polarity is inversed is the same with the ratio when the negative polarity is inversed.

Wherein the voltage compensation circuit includes a fourth switch, a fifth switch, a sixth switch, and a second capacitor, the fourth switch includes a control end, a first end, and a second end, the fifth switch and the sixth switch both include the control end, the input end and the output end, the control end of the fourth switch connects to the corresponding third scan line of the current pixel cell, the first end of the fourth switch connects to the second pixel electrode, the second end of the fourth switch connects to the output end of the sixth switch, the control end of the fifth switch connects to the corresponding first scanning line of the current pixel cell, the output end of the fifth switch connects to the corresponding data line of the current pixel cell, the output end of the fifth switch connects to one end of the second capacitor, the control end and the output end of the sixth switch connect to the output end of the fifth switch, and the other end of the second capacitor connects to the common electrode; and when the negative polarity is inversed, the scanning signals are inputted to the third scanning line to turn on the fourth switch, and the sixth switch is in the off-state such that the voltage compensation circuit is in the off-state, when the positive polarity is inversed, the scanning signals are inputted to the third scanning line to turn on the fourth switch, the sixth switch is in the on-state such that the voltage compensation circuit is in the on-state, the second capacitor charges the second pixel electrode via the sixth switch and the fourth switch in turn so that the voltage of the second pixel electrode is increased after being changed by the first capacitor.

Wherein the fourth switch, the fifth switch, and the sixth switch are thin film transistor (TFT) switches, a gate of TFT operating as the fourth switch corresponds to the control end of the fourth switch, a source of the TFT operating as the fourth switch corresponds to the first end of the fourth switch, a drain of the TFT operating as the fourth switch corresponds to the second end of the fourth switch, the gate of TFT operating as the fifth switch corresponds to the control end of the fifth switch, the source of the TFT operating as the fifth switch corresponds to the input end of the fifth switch, the drain of the TFT operating as the fifth switch corresponds to the output end of the fifth switch, and the gate of TFT operating as the sixth switch corresponds to the control end of the sixth switch, the source of the TFT operating as the sixth switch corresponds to the input end of the sixth switch, the drain of the TFT operating as the sixth switch corresponds to the output end of the sixth switch.

Wherein the first switch, the second switch, and the third switch are TFT switches.

Wherein when the positive polarity is inversed and the scanning signals are inputted to the third scanning line, the voltage compensation circuit is in the off-state such that the voltage of the second pixel electrode is retained at the level after being changed by the first capacitor, when the negative polarity is inversed and the scanning signals are inputted to the third scanning line, the voltage compensation circuit is in the on-state such that the voltage of the second pixel electrode is increased after being changed by the first capacitor, and thus the ratio of the voltage difference between the second pixel electrode and the common electrode to the voltage difference between the first pixel electrode and the common electrode when the positive polarity is inversed is the same with the ratio when the negative polarity is inversed.

In another aspect, a liquid crystal panel includes: an array substrate, a color filtering substrate, and a liquid crystal panel between the array substrate and the color filtering substrate, and the array substrate includes: a plurality of first scanning lines, a plurality of data lines, a plurality of pixel cells, and a common electrode, each of the pixel cells corresponds to one first scanning line and one data line, each of the pixel cell includes a first pixel electrode, a second pixel electrode, a first switch, a second switch, a third switch, a first capacitor, and a voltage compensation circuit, the corresponding first scanning line of a current pixel cell connects to the first switch and the second switch, the corresponding data line of the current pixel cell respectively connects to the first pixel electrode and the second pixel electrode via the first switch and the second switch, the third switch connects to the corresponding first scanning line of a next pixel cell arranged along a scanning direction, the next pixel cell is adjacent to the current pixel cell, the second pixel electrode connects to one end of the first capacitor via the third switch, the other end of the first capacitor connects to the common electrode, the voltage compensation circuit 1 connects to the corresponding second pixel electrode of the current pixel cell and connects to the corresponding first scanning line of a farther pixel cell, and the next pixel cell is arranged between the current pixel cell and the farther pixel cell along the scanning direction; and wherein the first scanning lines are scanned along the scanning direction in turn, the scanning signals are inputted to the corresponding first scanning line of the next pixel cell to turn on the third switch of the current pixel cell, a voltage of the second pixel electrode of the current pixel cell is changed due to the first capacitor, a capacitance of the first capacitor when a positive polarity is inversed is larger than the capacitance of the first capacitor when being driven by an inversed negative polarity, when the scanning signals are inputted to the corresponding first scanning line of the farther pixel cell, the voltage compensation circuit of the current pixel cell operates on the second pixel electrode of the current pixel cell such that a ratio of a voltage difference between the second pixel electrode and the common electrode to the voltage difference between the first pixel electrode and the common electrode when the positive polarity is inversed is the same with the ratio when the negative polarity is inversed.

Wherein when the negative polarity is inversed and when the scanning signals are inputted to the corresponding first scanning lines of the farther pixel cell, the voltage compensation circuit of the current pixel cell is in an off-state such that the voltage of the second pixel electrode of the current pixel cell is retained at a level after being changed by the first capacitor, when the positive polarity is inversed and when the scanning signals are inputted to the corresponding first scanning lines of the farther pixel cell, the voltage compensation circuit of the current pixel cell is in an on-state such that the voltage of the second pixel electrode increased after being changed by the first capacitor, and thus the ratio of the voltage difference between the second pixel electrode and the common electrode to the voltage difference between the first pixel electrode and the common electrode when the positive polarity is inversed is the same with the ratio when the negative polarity is inversed.

Wherein the voltage compensation circuit includes a fourth switch, a fifth switch, a sixth switch, and a second capacitor, the fourth switch includes a control end, a first end, and a second end, the fifth switch and the sixth switch both include the control end, the input end and the output end, the control end of the fourth switch connects to the corresponding first scanning line of the farther pixel cell, the first end of the fourth switch connects to the second pixel electrode, the second end of the fourth switch connects to the output end of the sixth switch, the control end of the fifth switch connects to the first scanning line of the current pixel cell, the input end of the fifth switch connects to the corresponding data line of the current pixel cell, the output end of the fifth switch connects to one end of the second capacitor, the control end and the input end of the sixth switch connects to the output end of the fifth switch, and the other end of the second capacitor connects to the common electrode; and when the negative polarity is inversed, the scanning signals are inputted to the corresponding scanning line of the farther pixel cell to turn on the fourth switch of the current pixel cell, the sixth switch is in the off-state such that the voltage compensation circuit of the current pixel electrode is in the off-state, when the positive polarity is inversed, the scanning signals are inputted to the corresponding scanning line of the farther pixel cell to turn on the fourth switch of the current pixel cell, the sixth switch is in the on-state such that the voltage compensation circuit of the current pixel electrode is in the on-state, the second capacitor of the current pixel cell charges the second pixel electrode via the sixth switch and the fourth switch in turn such that the voltage of the second pixel electrode is increased after being changed by the first capacitor.

Wherein the fourth switch, the fifth switch, and the sixth switch are thin film transistor (TFT) switches, a gate of TFT operating as the fourth switch corresponds to the control end of the fourth switch, a source of the TFT operating as the fourth switch corresponds to the first end of the fourth switch, a drain of the TFT operating as the fourth switch corresponds to the second end of the fourth switch, the gate of TFT operating as the fifth switch corresponds to the control end of the fifth switch, the source of the TFT operating as the fifth switch corresponds to the input end of the fifth switch, the drain of the TFT operating as the fifth switch corresponds to the output end of the fifth switch, and the gate of TFT operating as the sixth switch corresponds to the control end of the sixth switch, the source of the TFT operating as the sixth switch corresponds to the input end of the sixth switch, the drain of the TFT operating as the sixth switch corresponds to the output end of the sixth switch.

Wherein the first switch, the second switch, and the third switch are TFT switches.

In view of the above, the array substrate includes a voltage compensation circuit connecting to the second pixel electrode of the current pixel cell and the corresponding first scanning line of the farther pixel cell. The current pixel cell, the next pixel cell and the farther pixel cell are arranged along the scanning direction in turn. When the scanning signals are inputted to the corresponding first scanning line of the farther pixel cell, the voltage compensation circuit operates on the second pixel electrode. As such, the ratio of a voltage difference between the second pixel electrode and the common electrode to the voltage difference between the first pixel electrode and the common electrode when the positive polarity is inversed is the same with the ratio when the negative polarity is inversed. In this way, the low color shift effect is enhanced when the viewing angle is large. Also, the "burn-in" effect can be reduced at the same time so as to enhance the display performance.

DETAILED DESCRIPTION OF THE EMBODIMENTS

Embodiments of the invention will now be described more fully hereinafter with reference to the accompanying drawings, in which embodiments of the invention are shown.

Figure 3:
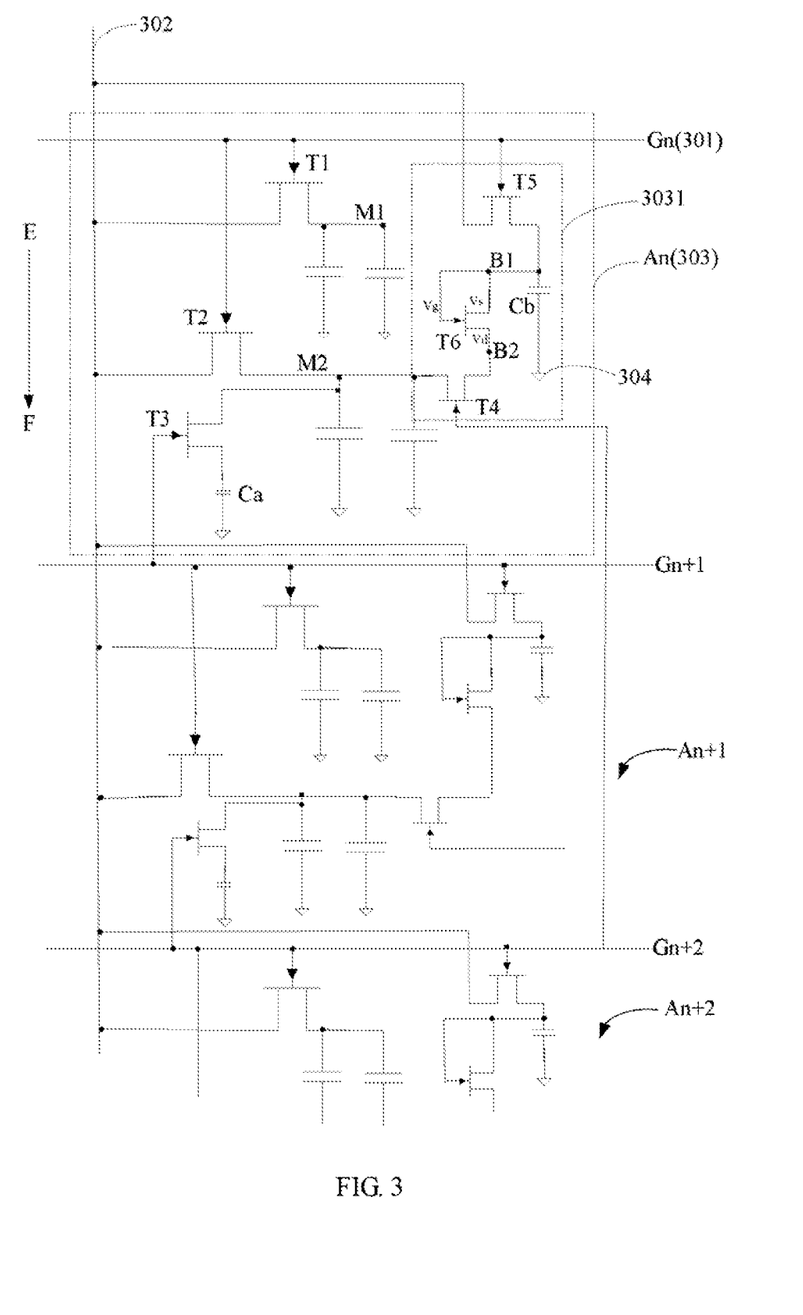
FIG. 3 is an equivalent circuit diagram of the pixel cell of the array substrate in accordance with one embodiment.

FIG. 3 is an equivalent circuit diagram of the pixel cell of the array substrate in accordance with one embodiment. The array substrate includes a plurality of first scanning lines 301, a plurality of data lines 302, a plurality of pixel cells 303, and a common electrode 304. Each of the pixel cells 303 corresponds to one first scanning line 301 and one data line 302.

Three pixel cells (An, An+1, An+2) are taken as examples to illustrate the connecting relationship of the pixel cells of the array substrate in accordance with one embodiment. It is to be noted that only portions of the above-mentioned pixel cells are shown. The three pixel cells An, An+1, An+2 with the same structure are arranged along a scanning direction (EF). The pixel cell (An) corresponds to the first scanning line (Gn). The pixel cell (An+1) corresponds to the first scanning line (Gn+1). The pixel cell (An+2) corresponds to the first scanning line (Gn+2).

The pixel cell (An) includes a first pixel cell (M1), a second pixel cell (M2), and a first switch (T1) and a second switch (T2) respectively operates for the first pixel cell (M1) and the second pixel cell (M2). Each of the pixel cells 303 further includes a third switch (T3), a first capacitor (Ca), and a voltage compensation circuit 3031. The first switch (T1) and the second switch (T2) both include a control end, an input end, and an output end. The third switch (13) includes a control end, a first end, and a second end. The control ends of the first switch (T1) and the second switch (T2) connect to the corresponding first scanning line (Gn) of the pixel cell (An). The input ends of the first switch (T1) and the second switch (T2) connect to the corresponding data line 302 of the pixel cell (An). The output ends of the first switch (T1) connects to the first pixel cell (M1). The output end of the second switch (T2) connects to the second pixel cell (M2). The control end of the third switch (T3) connects to the corresponding first scanning line (Gn+1) of the pixel cell (An+1). The pixel cell (An) and the pixel cell (An+1) are arranged along the scanning direction (EF) in turn, and the pixel cell (An+1) is adjacent to the pixel cell (An). The first end of the third switch (T3) connects to the second pixel cell (M2). The second end of the third switch (T3) connects to one end of the first capacitor (Ca). The other end of the first capacitor (Ca) connects to the common electrode 304.

The first switch (T1), the second switch (T2), and the third switch (T3) are thin film transistor (TFT). The control end of the first switch (T1) and the control end of the second switch (T2) corresponds to the gate of the TFT. The input ends of the first switch (T1) and the second switch (T2) corresponds to the source of the TFT. The output ends of the first switch (T1) and the second switch (T2) corresponds to the gate of the TFT. The control end of the third switch (T3) corresponds to the gate of the TFT. The first end of the third switch (T3) corresponds to the source of the TFT. The second end of the third switch (T3) corresponds to the drain of the TFT. In other embodiments, the first switch (T1), the second switch (12), and the third switch (T3) may be, but not limited to, triode or Darlington transistor.

In one embodiment, the array substrate is capable of reducing color difference in wide viewing angle so as to achieve low color shift effect.

Specifically, the array substrate is alternatively driven by inversed positive and negative polarity. When being driven by inversed negative polarity, i.e., the data voltage is smaller than the common voltage, the common electrode 304 inputs the common voltage, and the scanning signals are input to the first scanning lines (Gn, Gn+1, Gn+2) in turn along the scanning direction (EF). The first switch (T1) and the second switch (T2) are turn on when the corresponding first scanning line (Gn) of the pixel cell (An) is inputted with the scanning signals, and the data voltage is inputted to the data lines 302. The data voltage is then inputted to the first pixel cell (M1) and the second pixel cell (M2) of the pixel cell (An) via the first switch (T1) and the second switch (T2) such that the data voltage of the first pixel cell (M1) and the second pixel cell (M2) are the same. Afterward, the scanning signals are inputted to the corresponding first scanning line (Gn+1) of the pixel cell (An+1) to turn on the third switch (T3) of the pixel cell (An). The voltage of the second pixel cell (M2) is increased due to the charge sharing between the second pixel cell (M2) and the first capacitor (Ca). As such, the voltage of the second pixel cell (M2) is different from that of the first pixel cell (M1). Thus, the color difference in wide viewing angle is reduced and the low color shift effect is achieved.

When being driven by inversed positive polarity, i.e., the data voltage is larger than the common voltage, the common electrode 304 inputs the common voltage. The scanning signals are inputted to the first scanning lines (Gn, Gn+1, Gn+2) along the scanning direction (EF) in turn. The first switch (T1) and the second switch (T2) are turn on when the corresponding first scanning line (Gn) of the pixel cell (An) is inputted with the scanning signals, and the data voltage is inputted to the data lines 302. The data voltage is then inputted to the first pixel cell (M1) and the second pixel cell (M2) of the pixel cell (An) via the first switch (T1) and the second switch (T2) such that the data voltage of the first pixel cell (M1) and the second pixel cell (M2) are the same. Afterward, the scanning signals are inputted to the corresponding first scanning line (Gn+1) of the pixel cell (An+1) to turn on the third switch (T3) of the pixel cell (An). The voltage of the second pixel cell (M2) is decreased due to the charge sharing between the second pixel cell (M2) and the first capacitor (Ca). As such, the voltage of the second pixel cell (M2) is different from that of the first pixel cell (M1). Thus, the color difference in wide viewing angle is reduced and the low color shift effect is achieved.

In one embodiment, the structure of the first capacitor (Ca) is the same with typical capacitor such that the capacitance of the first capacitor (Ca) when being driven by inversed positive polarity is larger than that of the first capacitor (Ca) when being driven by inversed negative polarity. In this way, $$\frac{\Delta V_1}{\Delta V_2}$$

is not the same for the conditions that the inversed positive polarity method or the inversed negative polarity method is adopted, where $\Delta V_1$ represents the voltage difference between the second pixel cell (M2) and the first fixing frame 30, $\Delta V_2$ represents the voltage difference between the first pixel cell (M1) and the common electrode 304. That is, under the circumstance that the structure of FIG. 1 is adopted, i.e., the normal condition, the ratio $$\frac{\Delta V_1}{\Delta V_2}$$

for the condition that the inversed positive polarity is adopted is smaller than that for the condition that the inversed negative polarity is adopted, which may results in low color shift effect. BY adopting the voltage compensation circuit 3031, the low color shift problem due to the first capacitor (Ca) can be overcome so as to enhance the low color shift effect and the display performance.

Specifically, when the scanning signals are inputted to the corresponding first scanning line (Gn+2) of the pixel cell (An+2), the voltage compensation circuit 3031 of the pixel cell (An) operates on the second pixel cell (M2) such that $$\frac{\Delta V_1}{\Delta V_2}$$

is the same for all of the conditions regardless of the inversed positive or negative polarity. As such, the low color shift effect is enhanced, and the "burn-in" effect is reduced. It is to be noted that pixel cell (An+1) is arranged between the pixel cell (An) and the pixel cell (An+2) along the scanning direction (EF). When the inversed negative polarity is adopted and the scanning signals are inputted to the first scanning line (Gn+2) of the pixel cell (An+2), the voltage compensation circuit 3031 of the pixel cell (An) is in an off-state so as to retain the voltage of the second pixel cell (M2) at a level after it is increased by the first capacitor (Ca). As such, $\Delta V_1$ is the same with the normal condition. That is, $$\frac{\Delta V_1}{\Delta V_2}$$

is the same with the normal condition. When the inversed negative polarity is adopted and the scanning signals are inputted to the corresponding first scanning line (Gn+2) of the pixel cell (An+2), the voltage compensation circuit 3031 of the pixel cell (An) is in an on-state. The voltage of the second pixel cell (M2) of the pixel cell (An) increases due to the voltage compensation circuit 3031 after being decreased by the first capacitor (Ca) such that $\Delta V_1$ is larger than that of the normal condition. As such, $$\frac{\Delta V_1}{\Delta V_2}$$

is larger than that of the normal condition and thus the $$\frac{\Delta V_1}{\Delta V_2}$$

is the same for all of the conditions regardless of the inversed positive polarity or the inversed negative polarity.

The operating principle of the voltage compensation circuit 3031 will be described in detail hereinafter.

FIG. 3 is an equivalent circuit diagram of the pixel cell of the array substrate in accordance with one embodiment.

Referring to FIG. 3, the voltage compensation circuit 3031 includes a fourth switch (T4), a fifth switch (T5), a sixth switch (T6), and a second capacitor (Cb). The fourth switch (T4) includes the control end, the first end, and the second end. The fifth switch (T5) and the sixth switch (T6) both include the control end, the input end and the output end. The control end of the fourth switch (T4) connects to the corresponding first scanning line (Gn+2) of the pixel cell (An+2). The first end of the fourth switch (T4) connects to the second pixel cell (M2). The second end of the fourth switch (T4) connects to the output end of the sixth switch (T6). The control end of the fifth switch (T5) connects to the corresponding first scanning line (Gn) of the pixel cell (An). The input end of the fifth switch (T5) connects to the corresponding data lines 302 of the pixel cell (An). The output end of the fifth switch (T5) connects to one end of the second capacitor (Cb), and the other end of the second capacitor (Cb) connects to the common electrode 304. The control end and the input end of the sixth switch (T6) are short-connected, and both of the control end and the input end of the sixth switch (T6) connect to the output end of the fifth switch (T5). The output end of the sixth switch (T6) connects to the second end of the fourth switch (T4). The fourth switch (T4), the fifth switch (T5), and the sixth switch (T6) are TFT switches. The control end of the fourth switch (T4) corresponds to the gate of the TFT. The first end of the fourth switch (T4) corresponds to the source of the TFT. The second end of the fourth switch (T4) corresponds to the drain of the TFT. The control ends of the fifth switch (T5) and the sixth switch (T6) are gate of the TFT. The input ends of the fifth switch (T5) and the sixth switch (T6) correspond to the source of the TFT. The output ends of the fifth switch (T5) and the sixth switch (T6) correspond to the drain of the TFT. Whether the voltage compensation circuit 3031 is turned on or off is dependent on the on-state or off-state of the sixth switch (T6). According to the characteristic of the TFT, the sixth switch (T6) is turn on or off, which can be deemed as whether the current has passed by, is determined by the drain voltage (Vd) as the gate and the source of the sixth switch (T6) are connected.

When the inversed negative polarity is adopted and the scanning signals are inputted to the corresponding first scanning line (Gn) of the pixel cell (An), the fifth switch (T5) of the pixel cell (An) is turn on. The data signals inputted from the data lines 302 are also transmitted to the second capacitor (Cb) via the fifth switch (T5). At this moment, the voltage of B1 is the data voltage, and the voltage of B1 is the gate voltage (Vg) and the source voltage (Vs) of the sixth switch (T6). Afterward, the scanning signals are inputted to the corresponding first scanning line (Gn+1) of the pixel cell (An+1) to turn on the third switch (T3) of the pixel cell (An). The voltage of the second pixel cell (M2) of the pixel cell (An) is increased due to the first capacitor (Ca) such that the voltage of the second pixel cell (M2) is larger than the data voltage. In this way, when the scanning signals are inputted to the corresponding first scanning line (Gn+2) of the pixel cell (An+2), the fourth switch (T4) of the pixel cell (An) is turn on. The voltage of B2, i.e., the voltage of the second pixel cell (M2), is larger than the voltage of B1. The voltage of B2 is the drain voltage (Vd) of the sixth switch (T6). At this moment, the drain voltage (Vd) of the sixth switch (T6) is larger than the source voltage (Vs) such that the sixth switch (T6) is turn off. There is no current between the source and the drain and thus the voltage compensation circuit voltage compensation circuit 3031 of the pixel cell (An) is turn off. In this way, when the inversed negative polarity is adopted, the voltage of the second pixel cell (M2) is retained at the level after it is increased by the first capacitor (Ca). Thus, $$\frac{\Delta V_1}{\Delta V_2}$$

is the same for all of the conditions regardless of whether the inversed positive polarity or the inversed negative polarity is adopted.

When the inversed positive polarity is adopted and the scanning signals are inputted to the corresponding first scanning line (Gn) of the pixel cell (An), the fifth switch (T5) of the pixel cell (An) is turn on. The data signals inputted from the data lines 302 are also transmitted to the second capacitor (Cb) via the fifth switch (T5). At this moment, the voltage of B1 is the data voltage, and the voltage of B1 is the gate voltage (Vg) and the source voltage (Vs) of the sixth switch (T6). Afterward, the scanning signals are inputted to the corresponding first scanning line (Gn+1) of the pixel cell (An+1) to turn on the third switch (T3) of the pixel cell (An). The voltage of the second pixel cell (M2) of the pixel cell (An) is decreased due to the first capacitor (Ca) such that the voltage of the second pixel cell (M2) is smaller than the data voltage. In this way, when the scanning signals are inputted to the corresponding first scanning line (Gn+2) of the pixel cell (An+2), the fourth switch (T4) of the pixel cell (An) is turn on. The voltage of B2, i.e., the voltage of the second pixel cell (M2), is smaller than the voltage of B1. The drain voltage (Vd) of the sixth switch (T6) is smaller than the source voltage (Vs) such that the sixth switch (T6) is turn on and the current can pass through between the source and the drain. As such, the voltage compensation circuit 3031 of the pixel cell (An) is turn on. At this moment, the second capacitor (Cb) charges the second pixel cell (M2) via the sixth switch (T6) and the fourth switch (T4) in turn such that the voltage of the second pixel cell (M2) is increased after being decreased by the first capacitor (Ca). In this way, $$\frac{\Delta V_1}{\Delta V_2}$$

is larger than that in the normal condition when the inversed positive polarity is adopted. Thus, $$\frac{\Delta V_1}{\Delta V_2}$$

is the same for the conditions regardless whether the inversed positive polarity or the inversed negative polarity is adopted. The low color shift effect is enhanced, and the "burn-in" effect is reduced.

It is to be noted that a current-passing ability of the fourth switch (T4) may be controlled so as to guarantee that the voltage difference exists between the first pixel cell (M1) and the second pixel cell (M2) when the inversed positive polarity is adopted. That is, during a turn-on period of the fourth switch (T4), the voltage of the second pixel cell (M2) would not be increased to be the same with the voltage of the first pixel cell (M1) due to the voltage compensation circuit 3031. Further, according to the characteristics of the TFT, the current-passing ability of the fourth switch (T4) may be controlled be a width/length ratio of the fourth switch (T4). As such, during the turn-on period of the fourth switch (T4), a charging speed at which the second capacitor (Cb) charges the second pixel cell (M2) is controlled to keep the voltage of the second pixel cell (M2) from being increased to be the same with that of the first pixel cell (M1).

In other embodiments, the fourth switch (T4), the fifth switch (T5), and the sixth switch (T6) may be, but not limited to, triode or Darlington transistor.

In one embodiment, when the inversed positive polarity is adopted, the voltage of the second pixel cell (M2) is compensated by adding the voltage compensation circuit 3031 such that $$\frac{\Delta V_1}{\Delta V_2}$$

is the same with the condition when the inversed negative polarity is adopted. It can be understood that the problem of the typical solution, i.e., the $$\frac{\Delta V_1}{\Delta V_2}$$

of the condition for which the inversed positive polarity is adopted is smaller than that of the condition for which the inversed negative polarity is adopted.

Figure 4:
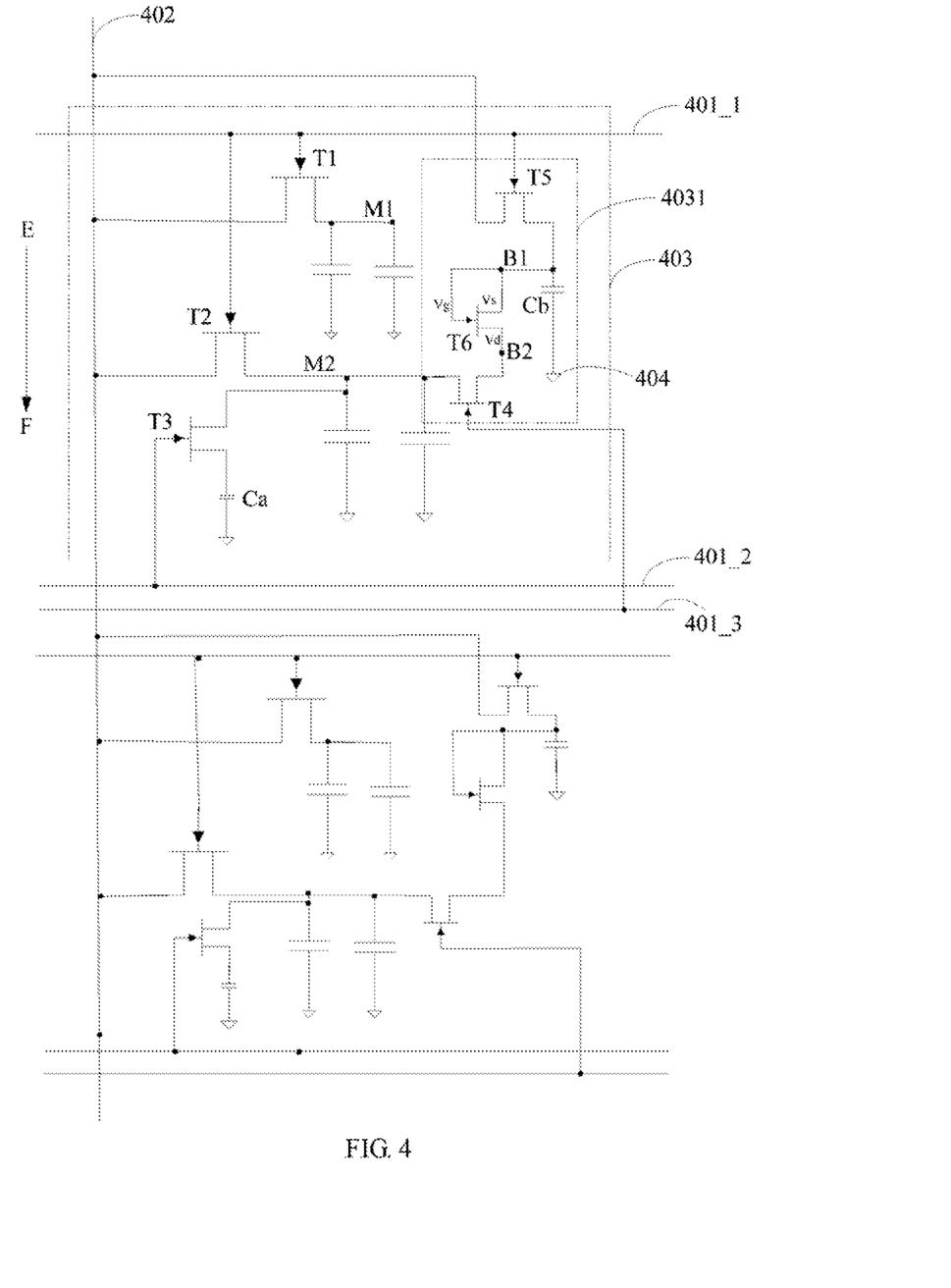
FIG. 4 is an equivalent circuit diagram of the pixel cell of the array substrate in accordance with another embodiment.

FIG. 4 is an equivalent circuit diagram of the pixel cell of the array substrate in accordance with another embodiment. The difference between this embodiment and the above embodiment resides in that at least one second scanning line (401_2) and at least one third scanning line (401_3) are added to respectively control the third switch (T3) and the fourth switch (T4). That is, the control end of the third switch (T3) connects to the corresponding second scanning line (401_2) of the pixel cell 403. The control end of the fourth switch (T4) connects to the corresponding third scanning line (401_3) of the pixel cell 403.

In the embodiment, the scanning signals are inputted to the first scanning line (401_1), the second scanning line (401_2), and the third scanning line (401_3) along the scanning direction (EF) in turn. The second scanning line (401_2) is inputted with the scanning signals so as to turn on the third switch (T3). At this moment, the voltage of the second pixel cell (M2) is changed by the first capacitor (Ca). The voltage of the second pixel cell (M2) is decreased when the inversed negative polarity is adopted, and the voltage of the second pixel cell (M2) is increased when the inversed positive polarity is adopted. As such, the voltage difference between the second pixel cell (M2) and the first pixel cell (M1) exists so as to achieve the low color shift effect. The third scanning line (401_3) is inputted with the scanning signals to turn on the fourth switch (T4). The voltage compensation circuit 4031 operates on the second pixel cell (M2) such that $$\frac{\Delta V_1}{\Delta V_2}$$

is the same for all of the conditions regardless of whether the inversed negative polarity or the inversed positive polarity is adopted. In this way, the low color shift effect is enhanced, and the "burn-in" effect is reduced. Detail operating process is omitted and may be referenced by the above embodiments It can be understood that the voltage compensation circuit 4031 is in the off-state when being driven by inversed negative polarity so as to retain the voltage of the second pixel cell (M2) to be at the level after being increased due to the first capacitor (Ca). Thus, the array substrate in FIG. 4 may also be driven by the following method. When the negative polarity is inversed, the scanning signals are not inputted to the third scanning line (401_3) to turn off the fourth switch (T4) such that even though the voltage compensation circuit 4031 has not connected to the second pixel cell (M2), the voltage of the second pixel cell (M2) can still be retained at the level after being increased due to the first capacitor (Ca). When the negative polarity is inversed, the scanning signals are inputted to the first scanning line (401_1), the second scanning line (401_2), and the third scanning line (401_3) in turn to turn. The voltage compensation circuit 4031 is turn on, and the voltage compensation circuit 4031 is electrically connected with the second pixel cell (M2). In this way, the second capacitor (Cb) charges the second pixel cell (M2) via the sixth switch (T6) and the fourth switch (T4) in turn to increase the voltage of the second pixel cell (M2).

Figure 5:
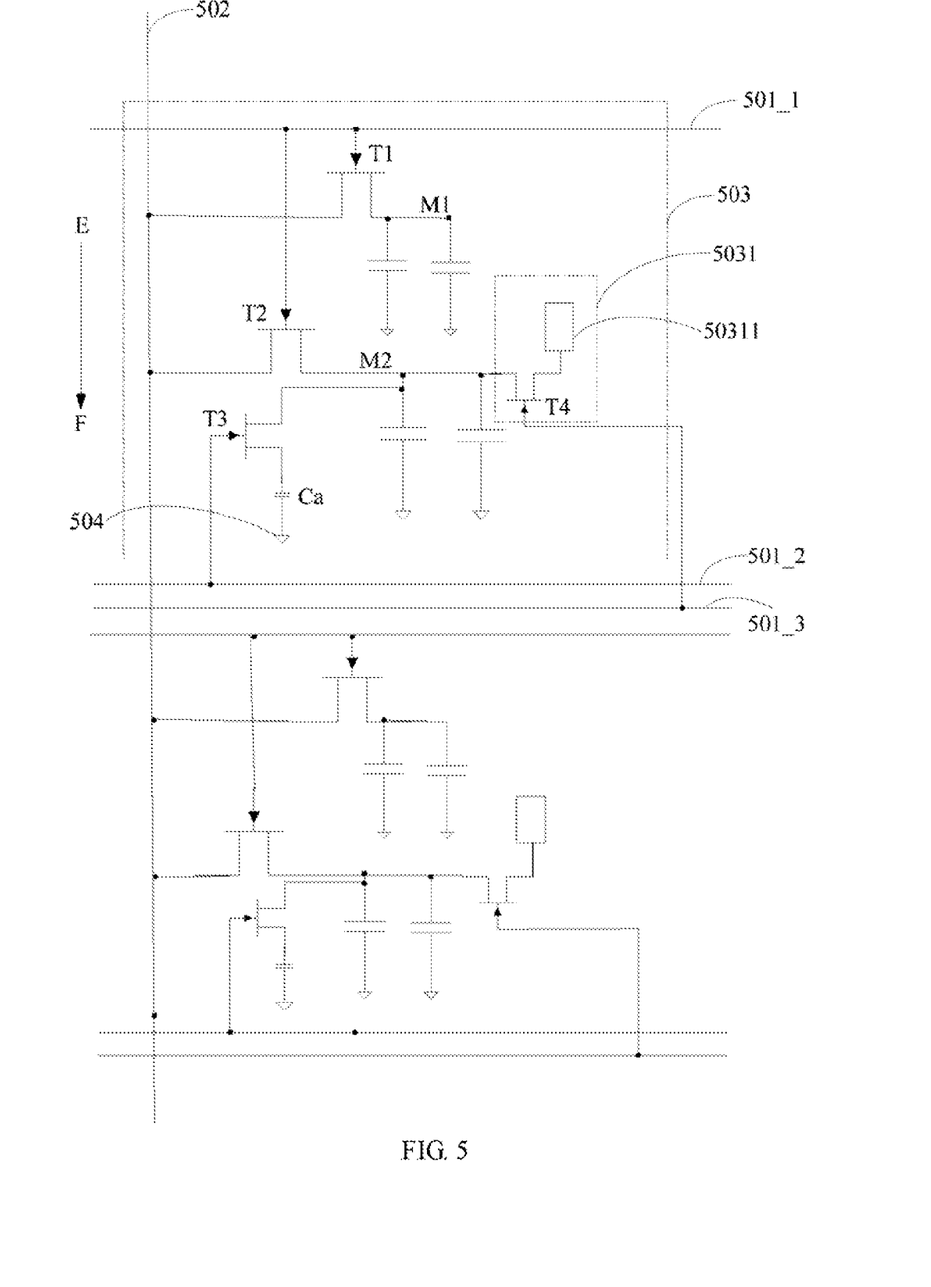
FIG. 5 is an equivalent circuit diagram of the pixel cell of the array substrate in accordance with another embodiment.

FIG. 5 is an equivalent circuit diagram of the pixel cell of the array substrate in accordance with another embodiment. The difference between FIGS. 4 and 5 resides in that the voltage compensation circuit 5031 in the embodiment includes the fourth switch (T4) and one reference voltage source 50311. The output voltage of the reference voltage source 50311 is not smaller than the data voltage inputted from the driving area 502 when the positive polarity is inversed. The control ends of the first switch (T1) and the second switch (T2) connect to the corresponding first scanning line (501_1) of the pixel cell 503. The control end of the third switch (T3) connects to the corresponding second scanning line (501_2) of the pixel cell 503. The control end of the fourth switch (T4) connects to the corresponding third scanning line (501_3) of the pixel cell 503. The first end of the fourth switch (T4) connects to the second pixel cell (M2). The second end of the fourth switch (T4) connects to the output end of the reference voltage source 50311.

When the negative polarity is inversed, the scanning signals are inputted to the first scanning line (501_1), and the second scanning line (501_2) of the pixel cell 503 along the scanning direction (EF) in turn. The scanning signals inputted to the second scanning line (501_2) turns on the third switch (T3). The voltage of the second pixel cell (M2) is increased due to the first capacitor (Ca) such that the voltage of the second pixel cell (M2) is different from that of the first pixel cell (M1), and thus the low color shift effect is achieved. The scanning signals is not inputted to the third scanning line (501_3) such that the fourth switch (T4) is in the off-state. In this way, the voltage of the second pixel cell (M2) is retained at the level after being increased by the first capacitor (Ca). When the positive polarity is inversed, the scanning signals are inputted to the corresponding first scanning line (501_1), the second scanning line (501_2), and the third scanning line (501_3) along the scanning direction (EF) in turn. The scanning signals inputted to the second scanning line (501_2) turns on the third switch (T3). The voltage of the second pixel cell (M2) is decreased due to the first capacitor (Ca) such that the voltage of the second pixel cell (M2) is different from that of the first pixel cell (M1) so as to achieve the low color shift effect. The scanning signals inputted to the third scanning line (501_3) turns on the fourth switch (T4). At this moment, as the voltage of the reference voltage source 50311 is larger than that of the second pixel cell (M2), the reference voltage source 50311 charges the second pixel cell (M2) during the turn-on period of the fourth switch (T4). In this way, the voltage of the second pixel cell (M2) is increased after being decreased due to the first capacitor (Ca). As such, $$\frac{\Delta V_1}{\Delta V_2}$$

is the same for the conditions regardless being driven by the inversed positive polarity or the inversed negative polarity. Thus, the low color shift effect is enhanced and the "burn-in" effect is reduced In the above embodiments, when the positive polarity is inversed, the voltage compensation circuit charges the second pixel cell (M2) such that $$\frac{\Delta V_1}{\Delta V_2}$$

is the same for the conditions regardless of being driven by the inversed positive polarity or the inversed negative polarity. In another embodiment, when the negative polarity is inversed, the voltage compensation circuit charges the second pixel cell (M2) such that $$\frac{\Delta V_1}{\Delta V_2}$$

is the same for the conditions regardless of being driven by the inversed positive polarity or the inversed negative polarity. In the embodiment, the structure of the array substrate is similar to that of the array substrate in FIG. 5. The difference resides in that the output voltage of the reference voltage source 50311 is not smaller than the common voltage of the second conductive lines 504, and the driving method is not the same.

Figure 6:
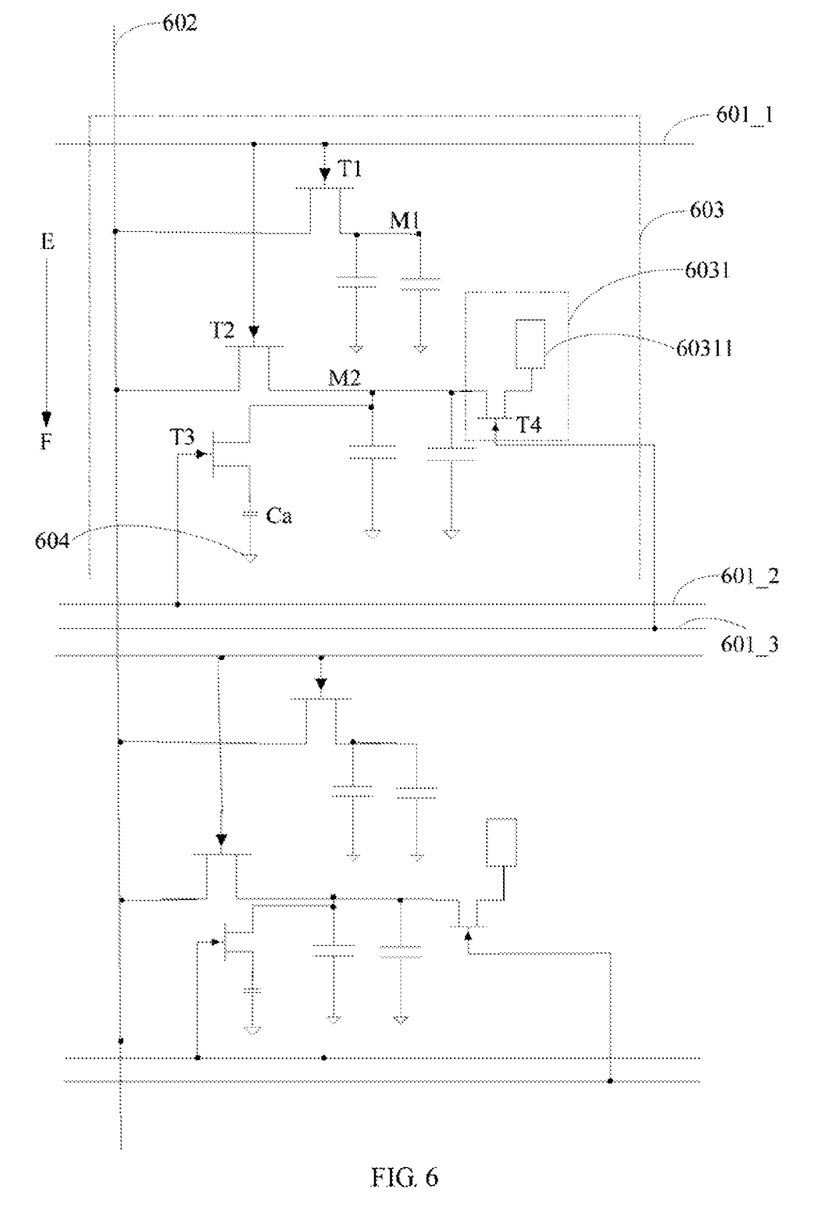
FIG. 6 is an equivalent circuit diagram of the pixel cell of the array substrate in accordance with another embodiment.

FIG. 6 is an equivalent circuit diagram of the pixel cell of the array substrate in accordance with another embodiment. Referring to FIG. 6, the structure of the array substrate is similar to that of the array substrate in FIG. 5. The differences reside in that the driving method and the output voltage of the reference voltage source are not the same.

The output voltage of the reference voltage source 60311 is not smaller than the common voltage of the 604. In the embodiment, when the positive polarity is inversed, the scanning signals are inputted to the corresponding first scanning line (601_1), the second scanning line (601_2), the third scanning line (601_3) of the pixel cell 603 along the scanning direction (EF) in turn. The scanning signals inputted to the second scanning line (601_2) turns on the third switch (T3). The voltage of the second pixel cell (M2) is decreased by the first capacitor (Ca) such that the voltage of the second pixel cell (M2) is different from that of the first pixel cell (M1) so as to achieve the low color shift effect. The scanning signals are not inputted to the third scanning line (601_3) such that the fourth switch (T4) is in the off-state. Thus, the voltage of the second pixel cell (M2) is retained at the level after being decreased due to the first capacitor (Ca). When the positive polarity is inversed, $\Delta V_1$ is the same with that for the normal condition. That is, when the positive polarity is inversed, $\Delta V_1$ remains the same with that for the normal condition such that the $$\frac{\Delta V_1}{\Delta V_2}$$

also remains the same with that for the normal condition. When the negative polarity is inversed, the scanning signals are inputted to the corresponding first scanning line (601_1), the second scanning line (601_2), and the third scanning line (601_3) of the pixel cell 603 along the scanning direction (EF) in turn. The scanning signals inputted to the second scanning line (601_2) turns on the third switch (T3).

The voltage of the second pixel cell (M2) is increased by the first capacitor (Ca) such that the voltage of the second pixel cell (M2) is different from that of the first pixel cell (M1) so as to achieve the low color shift effect. The scanning signals are inputted to the third scanning line (601_3) to turn on the fourth switch (T4). As the output voltage of the reference voltage source 60311 is larger than the common voltage, the voltage of the second pixel cell (M2) is still smaller than the common voltage after being increased due to the first capacitor (Ca). Thus, the reference voltage source 60311 charges the second pixel cell (M2) during the turn-on period such that the voltage of the second pixel cell (M2) is increased after being increased by the first capacitor (Ca). When the negative polarity is inversed, $\Delta V_1$ is smaller than that for the normal condition. As such, $$\frac{\Delta V_1}{\Delta V_2}$$

is smaller than that for the normal condition. In this way, $$\frac{\Delta V_1}{\Delta V_2}$$

is the same for the conditions regardless of being driven by the inversed positive polarity or the inversed negative polarity. As such, the low color shift effect is enhanced, and the "burn-in" effect is reduced.

Figure 7:
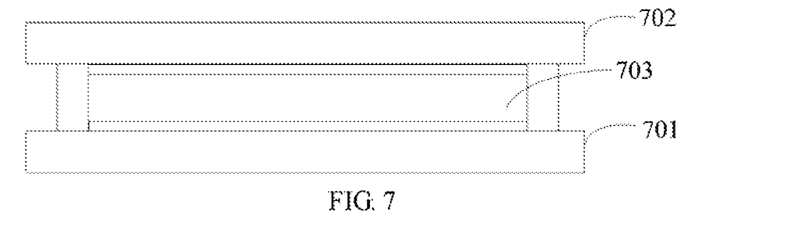
FIG. 7 is a side view of the liquid crystal panel in accordance with one embodiment.

FIG. 7 is a side view of the liquid crystal panel in accordance with one embodiment. The liquid crystal panel includes an array substrate 701, a color filtering substrate 702, and a liquid crystal layer between the array substrate 701 and the color filtering substrate 702. The array substrate 701 may be any one of the array substrate in the above embodiments.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:
1. An array substrate, comprising:
a plurality of first scanning lines, a plurality of data lines, a plurality of pixel cells, and a common electrode, each of the pixel cells corresponds to one first scanning line and one data line, each of the pixel cell comprises a first pixel electrode, a second pixel electrode, a first switch, a second switch, a third switch, a first capacitor, and a voltage compensation circuit, the corresponding first scanning line of a current pixel cell connects to the first switch and the second switch, the corresponding data line of the current pixel cell respectively connects to the first pixel electrode and the second pixel electrode via the first switch and the second switch, the third switch connects to the corresponding first scanning line of a next pixel cell, the current pixel cell and the next pixel cell are arranged along a scanning direction and the next pixel cell is adjacent to the current pixel cell, the second pixel electrode connects to one end of the first capacitor via the third switch, the other end of the first capacitor connects to the common electrode, the voltage compensation circuit 1 connects to the corresponding second pixel electrode of the current pixel cell and connects to the corresponding first scanning line of a farther pixel cell, and the next pixel cell is arranged between the current pixel cell and the farther pixel cell along the scanning direction; and wherein the first scanning lines are scanned along the scanning direction in turn, the scanning signals are inputted to the corresponding first scanning line of the next pixel cell to turn on the third switch of the current pixel cell, a voltage of the second pixel electrode of the current pixel cell is changed due to the first capacitor, a capacitance of the first capacitor when a positive polarity is inversed is larger than the capacitance of the first capacitor when a negative polarity is inversed, when the scanning signals are inputted to the corresponding first scanning line of the farther pixel cell, the voltage compensation circuit of the current pixel cell operates on the second pixel electrode of the current pixel cell such that a ratio of a voltage difference between the second pixel electrode and the common electrode to the voltage difference between the first pixel electrode and the common electrode when the positive polarity is inversed is the same with the ratio when the negative polarity is inversed.

2. The array substrate as claimed in claim 1, when the negative polarity is inversed and when the scanning signals are inputted to the corresponding first scanning lines of the farther pixel cell, the voltage compensation circuit of the current pixel cell is in an off-state such that the voltage of the second pixel electrode of the current pixel cell is retained at a level after being changed by the first capacitor, when the positive polarity is inversed and when the scanning signals are inputted to the corresponding first scanning lines of the farther pixel cell, the voltage compensation circuit of the current pixel cell is in an on-state such that the voltage of the second pixel electrode increased after being changed by the first capacitor, and thus the ratio of the voltage difference between the second pixel electrode and the common electrode to the voltage difference between the first pixel electrode and the common electrode when the positive polarity is inversed is the same with the ratio when the negative polarity is inversed.

3. The array substrate as claimed in claim 2, wherein the voltage compensation circuit comprises a fourth switch, a fifth switch, a sixth switch, and a second capacitor, the fourth switch comprises a control end, a first end, and a second end, the fifth switch and the sixth switch both comprise the control end, the input end and the output end, the control end of the fourth switch connects to the corresponding first scanning line of the farther pixel cell, the first end of the fourth switch connects to the second pixel electrode, the second end of the fourth switch connects to the output end of the sixth switch, the control end of the fifth switch connects to the first scanning line of the current pixel cell, the input end of the fifth switch connects to the corresponding data line of the current pixel cell, the output end of the fifth switch connects to one end of the second capacitor, the control end and the input end of the sixth switch connects to the output end of the fifth switch, and the other end of the second capacitor connects to the common electrode; and when the negative polarity is inversed, the scanning signals are inputted to the corresponding scanning line of the farther pixel cell to turn on the fourth switch of the current pixel cell, the sixth switch is in the off-state such that the voltage compensation circuit of the current pixel electrode is in the off-state, and when the positive polarity is inversed, the scanning signals are inputted to the corresponding scanning line of the farther pixel cell to turn on the fourth switch of the current pixel cell, the sixth switch is in the on-state such that the voltage compensation circuit of the current pixel electrode is in the on-state, the second capacitor of the current pixel cell charges the second pixel electrode via the sixth switch and the fourth switch in turn such that the voltage of the second pixel electrode is increased after being changed by the first capacitor.

4. The array substrate as claimed in claim 3, wherein the fourth switch, the fifth switch, and the sixth switch are thin film transistor (TFT) switches, a gate of TFT operating as the fourth switch corresponds to the control end of the fourth switch, a source of the TFT operating as the fourth switch corresponds to the first end of the fourth switch, a drain of the TFT operating as the fourth switch corresponds to the second end of the fourth switch, the gate of TFT operating as the fifth switch corresponds to the control end of the fifth switch, the source of the TFT operating as the fifth switch corresponds to the input end of the fifth switch, the drain of the TFT operating as the fifth switch corresponds to the output end of the fifth switch, and the gate of TFT operating as the sixth switch corresponds to the control end of the sixth switch, the source of the TFT operating as the sixth switch corresponds to the input end of the sixth switch, the drain of the TFT operating as the sixth switch corresponds to the output end of the sixth switch.

5. The array substrate as claimed in claim 1, wherein the first switch, the second switch, and the third switch are TFT switches.

6. An array substrate, comprising:

a plurality of first scanning lines, a plurality of second scanning lines, a plurality of third scanning lines, a plurality of data lines, a plurality of pixel cells, and a common electrode, each of the pixel cells corresponds to one first scanning line, one second scanning line, one third scanning line and one data line, each of the pixel cell comprises a first pixel electrode, a second pixel electrode, a first switch, a second switch, a third switch, a first capacitor, and a voltage compensation circuit, the corresponding first scanning line of a current pixel cell connects to the first switch and the second switch, the corresponding data line of the current pixel cell respectively connects to the first pixel electrode and the second pixel electrode via the first switch and the second switch, the corresponding second scanning line connects to the third switch, the second pixel electrode connects to one end of the first capacitor via the third switch, the other end of the first capacitor connects to the common electrode, the voltage compensation circuit connects to the corresponding third scanning line of the pixel cell and the second pixel electrode; and wherein the corresponding first, second, and third scanning lines of the current pixel cell are scanned in turn, the scanning signals inputted to the second scanning line turns on the third switch, the voltage of the second pixel electrode is changed by the first capacitor, a capacitance of the first capacitor when a positive polarity is inversed is larger than the capacitance of the first capacitor when a negative polarity is inversed, when the scanning signals are inputted to the third scanning line, the voltage compensation circuit operates on the second pixel electrode such that a ratio of a voltage difference between the second pixel electrode and the common electrode to the voltage difference between the first pixel electrode and the common electrode when the positive polarity is inversed is the same with the ratio when the negative polarity is inversed.

7. The array substrate as claimed in claim 6, wherein when the negative polarity is inversed and when the scanning signals are inputted to the third scanning line, the voltage compensation circuit is in an off-state such that the voltage of the second pixel electrode is retained as a level after being changed by the first capacitor, when the negative polarity is inversed and when the scanning signals are inputted to the third scanning line, the voltage compensation circuit is in an on-state such that the voltage of the second pixel electrode is increased after being changed by the first capacitor, and thus the ratio of the voltage difference between the second pixel electrode and the common electrode to the voltage difference between the first pixel electrode and the common electrode when the positive polarity is inversed is the same with the ratio when the negative polarity is inversed.

8. The array substrate as claimed in claim 7, wherein the voltage compensation circuit comprises a fourth switch, a fifth switch, a sixth switch, and a second capacitor, the fourth switch comprises a control end, a first end, and a second end, the fifth switch and the sixth switch both comprise the control end, the input end and the output end, the control end of the fourth switch connects to the corresponding third scan line of the current pixel cell, the first end of the fourth switch connects to the second pixel electrode, the second end of the fourth switch connects to the output end of the sixth switch, the control end of the fifth switch connects to the corresponding first scanning line of the current pixel cell, the output end of the fifth switch connects to the corresponding data line of the current pixel cell, the output end of the fifth switch connects to one end of the second capacitor, the control end and the output end of the sixth switch connect to the output end of the fifth switch, and the other end of the second capacitor connects to the common electrode;

when the negative polarity is inversed, the scanning signals are inputted to the third scanning line to turn on the fourth switch, and the sixth switch is in the off-state such that the voltage compensation circuit is in the off-state, when the positive polarity is inversed, the scanning signals are inputted to the third scanning line to turn on the fourth switch, the sixth switch is in the on-state such that the voltage compensation circuit is in the on-state, the second capacitor charges the second pixel electrode via the sixth switch and the fourth switch in turn so that the voltage of the second pixel electrode is increased after being changed by the first capacitor.

9. The array substrate as claimed in claim 8, wherein the fourth switch, the fifth switch, and the sixth switch are thin film transistor (TFT) switches, a gate of TFT operating as the fourth switch corresponds to the control end of the fourth switch, a source of the TFT operating as the fourth switch corresponds to the first end of the fourth switch, a drain of the TFT operating as the fourth switch corresponds to the second end of the fourth switch, the gate of TFT operating as the fifth switch corresponds to the control end of the fifth switch, the source of the TFT operating as the fifth switch corresponds to the input end of the fifth switch, the drain of the TFT operating as the fifth switch corresponds to the output end of the fifth switch, and the gate of TFT operating as the sixth switch corresponds to the control end of the sixth switch, the source of the TFT operating as the sixth switch corresponds to the input end of the sixth switch, the drain of the TFT operating as the sixth switch corresponds to the output end of the sixth switch.

10. The array substrate as claimed in claim 6, wherein the first switch, the second switch, and the third switch are TFT switches.

11. The array substrate as claimed in claim 6, wherein when the positive polarity is inversed and the scanning signals are inputted to the third scanning line, the voltage compensation circuit is in the off-state such that the voltage of the second pixel electrode is retained at the level after being changed by the first capacitor, when the negative polarity is inversed and the scanning signals are inputted to the third scanning line, the voltage compensation circuit is in the on-state such that the voltage of the second pixel electrode is increased after being changed by the first capacitor, and thus the ratio of the voltage difference between the second pixel electrode and the common electrode to the voltage difference between the first pixel electrode and the common electrode when the positive polarity is inversed is the same with the ratio when the negative polarity is inversed.

12. A liquid crystal panel, comprising:
an array substrate, a color filtering substrate, and a liquid crystal panel between the array substrate and the color filtering substrate, and the array substrate comprises:
a plurality of first scanning lines, a plurality of data lines, a plurality of pixel cells, and a common electrode, each of the pixel cells corresponds to one first scanning line and one data line, each of the pixel cell comprises a first pixel electrode, a second pixel electrode, a first switch, a second switch, a third switch, a first capacitor, and a voltage compensation circuit, the corresponding first scanning line of a current pixel cell connects to the first switch and the second switch, the corresponding data line of the current pixel cell respectively connects to the first pixel electrode and the second pixel electrode via the first switch and the second switch, the third switch connects to the corresponding first scanning line of a next pixel cell arranged along a scanning direction, the next pixel cell is adjacent to the current pixel cell, the second pixel electrode connects to one end of the first capacitor via the third switch, the other end of the first capacitor connects to the common electrode, the voltage compensation circuit 1 connects to the corresponding second pixel electrode of the current pixel cell and connects to the corresponding first scanning line of a farther pixel cell, and the next pixel cell is arranged between the current pixel cell and the farther pixel cell along the scanning direction; and wherein the first scanning lines are scanned along the scanning direction in turn, the scanning signals are inputted to the corresponding first scanning line of the next pixel cell to turn on the third switch of the current pixel cell, a voltage of the second pixel electrode of the current pixel cell is changed due to the first capacitor, a capacitance of the first capacitor when a positive polarity is inversed is larger than the capacitance of the first capacitor when being driven by an inversed negative polarity, when the scanning signals are inputted to the corresponding first scanning line of the farther pixel cell, the voltage compensation circuit of the current pixel cell operates on the second pixel electrode of the current pixel cell such that a ratio of a voltage difference between the second pixel electrode and the common electrode to the voltage difference between the first pixel electrode and the common electrode when the positive polarity is inversed is the same with the ratio when the negative polarity is inversed.

13. The liquid crystal panel as claimed in claim 12, when the negative polarity is inversed and when the scanning signals are inputted to the corresponding first scanning lines of the farther pixel cell, the voltage compensation circuit of the current pixel cell is in an off-state such that the voltage of the second pixel electrode of the current pixel cell is retained at a level after being changed by the first capacitor, when the positive polarity is inversed and when the scanning signals are inputted to the corresponding first scanning lines of the farther pixel cell, the voltage compensation circuit of the current pixel cell is in an on-state such that the voltage of the second pixel electrode increased after being changed by the first capacitor, and thus the ratio of the voltage difference between the second pixel electrode and the common electrode to the voltage difference between the first pixel electrode and the common electrode when the positive polarity is inversed is the same with the ratio when the negative polarity is inversed.

14. The liquid crystal panel as claimed in claim 13, wherein the voltage compensation circuit comprises a fourth switch, a fifth switch, a sixth switch, and a second capacitor, the fourth switch comprises a control end, a first end, and a second end, the fifth switch and the sixth switch both comprise the control end, the input end and the output end, the control end of the fourth switch connects to the corresponding first scanning line of the farther pixel cell, the first end of the fourth switch connects to the second pixel electrode, the second end of the fourth switch connects to the output end of the sixth switch, the control end of the fifth switch connects to the first scanning line of the current pixel cell, the input end of the fifth switch connects to the corresponding data line of the current pixel cell, the output end of the fifth switch connects to one end of the second capacitor, the control end and the input end of the sixth switch connects to the output end of the fifth switch, and the other end of the second capacitor connects to the common electrode; and when the negative polarity is inversed, the scanning signals are inputted to the corresponding scanning line of the farther pixel cell to turn on the fourth switch of the current pixel cell, the sixth switch is in the off-state such that the voltage compensation circuit of the current pixel electrode is in the off-state, when the positive polarity is inversed, the scanning signals are inputted to the corresponding scanning line of the farther pixel cell to turn on the fourth switch of the current pixel cell, the sixth switch is in the on-state such that the voltage compensation circuit of the current pixel electrode is in the on-state, the second capacitor of the current pixel cell charges the second pixel electrode via the sixth switch and the fourth switch in turn such that the voltage of the second pixel electrode is increased after being changed by the first capacitor.

15. The liquid crystal panel as claimed in claim 14, wherein the fourth switch, the fifth switch, and the sixth switch are thin film transistor (TFT) switches, a gate of TFT operating as the fourth switch corresponds to the control end of the fourth switch, a source of the TFT operating as the fourth switch corresponds to the first end of the fourth switch, a drain of the TFT operating as the fourth switch corresponds to the second end of the fourth switch, the gate of TFT operating as the fifth switch corresponds to the control end of the fifth switch, the source of the TFT operating as the fifth switch corresponds to the input end of the fifth switch, the drain of the TFT operating as the fifth switch corresponds to the output end of the fifth switch, and the gate of TFT operating as the sixth switch corresponds to the control end of the sixth switch, the source of the TFT operating as the sixth switch corresponds to the input end of the sixth switch, the drain of the TFT operating as the sixth switch corresponds to the output end of the sixth switch.

16. The liquid crystal panel as claimed in claim 12, wherein the first switch, the second switch, and the third switch are TFT switches.

* * * * *